(12) United States Patent
Sakaguchi

(10) Patent No.: US 6,766,485 B1
(45) Date of Patent: *Jul. 20, 2004

(54) INTEGRATED CIRCUIT FAULT TESTER, INTEGRATED CIRCUIT FAULT TEST METHOD AND RECORDING MEDIUM RECORDED WITH FAULT TEST CONTROL PROGRAM

(75) Inventor: Kazuhiro Sakaguchi, Tokyo (JP)

(73) Assignee: NEC Electronics Corporation (JP)

( * ) Notice: Subject to any disclaimer, the term of this patent is extended or adjusted under 35 U.S.C. 154(b) by 499 days.

This patent is subject to a terminal disclaimer.

(21) Appl. No.: 09/669,113

(22) Filed: Sep. 25, 2000

(30) Foreign Application Priority Data

Sep. 27, 1999 (JP) .......................................... 11-273186

(51) Int. Cl.⁷ ............................................. G01R 31/28
(52) U.S. Cl. ..................... 714/724; 714/811; 324/763; 324/765
(58) Field of Search ............................... 714/811, 724; 324/763, 765, 73 R

(56) References Cited

U.S. PATENT DOCUMENTS

| 4,506,212 | A | * | 3/1985 | Melia ........................ 324/73 R |
| 5,283,790 | A | * | 2/1994 | Kawashita ................... 371/101 |
| 5,949,798 | A | | 9/1999 | Sakaguchi ................ 371/27.1 |
| 6,005,407 | A | * | 12/1999 | Arabi et al. ................ 324/765 |
| 6,246,248 | B1 | * | 6/2001 | Yamagishi .................. 324/763 |
| 6,414,507 | B1 | * | 7/2002 | Hanajima .................... 324/765 |

FOREIGN PATENT DOCUMENTS

| JP | 363248252 A | * 10/1988 | .................. 714/746 |
| JP | 9-211088 | 8/1997 | ......... G01R/31/319 |
| JP | 11-142468 | 5/1999 | ........... G01R/31/26 |
| JP | 11-142468 | 5/2000 | ........... G01R/31/26 |

* cited by examiner

Primary Examiner—Albert Decady
Assistant Examiner—Dipakkumar Gandhi
(74) Attorney, Agent, or Firm—Hayes Soloway P.C.

(57) ABSTRACT

A unit test signal having duration T is repeatedly supplied from an LSI tester to an IC under test and, simultaneously, a power source current is supplied from the LSI tester through a current detection unit to the IC under test. The power source current is monitored by the current detection unit and a current information obtained by the monitoring is analyzed by a spectrum analyzer unit. Since the repetition period of the test signal is T, the power source current having a period $nT$ flows through the IC under test along with a state shift of the IC under test, where n is an integer. When the IC under test has a fault, the power source current flows with a period $n'T$, where $n'$ is an integer different from n, or an abnormal power source current flows with the period $nT$, due to a change of the state shift of the IC under test. A decision unit performs a fault decision of the IC under test by judging an existence of abnormal power source current or the change of the state shift of the IC under test on the basis of values of spectral power in the vicinity of a frequency $1/nT$ and high harmonics thereof of the power source current or existence or absence of peak having such period.

9 Claims, 9 Drawing Sheets

INTEGRATED CIRCUIT FAULT TESTER, INTEGRATED CIRCUIT FAULT TEST METHOD AND RECORDING MEDIUM RECORDED WITH FAULT TEST CONTROL PROGRAM

CROSS REFERENCE TO RELATED APPLICATIONS

The present invention claims priority from Japanese Patent Application No. 11-273186 filed Sep. 27, 1999, the contents of which are incorporated herein by reference.

BACKGROUND OF THE INVENTION

1. Field of the Invention

The present invention relates to a fault test of an IC (integrated circuit) and, particularly, to a determination of a fault of an IC based on a frequency spectrum analysis of a power source current.

2. Description of Related Art

In order to realize a high quality fault test and perform a fault test in a short time at low cost, it has been usual to detect a fault of an IC by analyzing a frequency spectrum of a power source current. For example, JP 11-142468 A discloses a technique in which an IC is determined as defective or acceptable by successively and repeatedly applying a unit test signal having a duration T to the IC and observing spectral powers of power source current flowing through the IC at a frequency 1/T corresponding to the duration T of the unit test signal and high harmonic frequencies which are integer multiples of the frequency 1/T. The disclosed technique is based on that, when the unit test signal is applied to an IC to be tested for the period T, the power source current having a constant waveform always flows for the period T.

However, depending upon an IC to be tested, there is a case where, even when the same test signal is inputted thereto, the same power source current having always the same waveform is not always flows. An example of such case is shown in FIG. 10, which explains the period of the waveform of power source current with respect to the unit test signal having the period T in a fault test of IC.

In FIG. 10, it is assumed that, when a unit test signal 1801 is applied to an IC under test, a state 1802 of the IC becomes a state A. In such case, the power source current 1803 becomes power source current A. When the same unit test signal is applied thereto secondly, the state 1802 of the IC becomes B, in which case the power source current 1803 flowing through the IC becomes B. With supply of a next unit test signal 1801 to the IC under test, the state returns to A and current A flows through the IC. Therefore, in the case where the state of the IC is alternated between A and B every time the unit test signal 1801 is supplied to the IC, the current flowing through the IC is changed between A and B. Consequently, the period of the power source current 1803 becomes twice the period T of the unit test signal, that is, 2T.

In a case where the state of the IC is changed from A through B to C repeatedly with supply of the unit test signals 1801 as shown in the state 1804, the period of the power source current 1805 becomes 3T.

In such conventional fault test of the IC, the spectral power at only frequency 1/T and high harmonics thereof are monitored. Therefore, an accurate test is difficult.

SUMMARY OF THE INVENTION

An object of the present invention is to provide a fault tester of IC, which is capable of detecting fault of IC accurately, a test method thereof and a recording medium recorded with a detection control program of the method.

The present invention is based on the fact that the reason why a constant power source current does not always flow through an IC under test even when identical unit test signals 1801 are supplied to the IC as shown in FIG. 10 is that the IC has a memory function and the power source current flowing through the IC according to the unit test signal depends upon the memory content of the IC and, therefore, even if the application periods of the unit test signal are constantly T, the period of the power source current flowing through the IC becomes an integer multiple of T. In such case, peaks of the frequency spectrum of the power source current appear at high harmonic frequencies, which are integer multiples of a basic frequency $1/nT$ where n is an integer. The present invention is featured by performing a test on the basis of this fact.

That is, according to a first aspect of the present invention, a fault tester for detecting a fault of an IC by monitoring power source current flowing through the IC when the latter is operated by test signals having a constant period T is provided, which is featured by comprising current detection means for monitoring a power source current supplied to the IC, spectrum analysis means for obtaining a frequency spectrum of the power source current detected by the current detection means and determination means for determining whether or not the IC has a fault on the basis of values of spectral power at frequencies in the spectrum, which are integer multiples of $1/nT$, where n is an integer preliminary defined for the IC under test.

According to a second aspect of the present invention, a fault tester for detecting a fault of an IC by monitoring power source current flowing through the IC when the latter is operated by test signals having a constant period T is provided, which is featured by comprising current detection means for monitoring a power source current supplied to the IC, spectrum analysis means for obtaining a frequency spectrum of the power source current detected by the current detection means and determination means for determining whether or not the IC has a fault, the determination means being adapted, when a peak frequency in the frequency spectrum of the IC under test obtained by the spectrum analysis means is assumed as $1/nT$, where n is an integer, to obtain an integer n' representative of peak frequencies of respective power peaks of the frequency spectrum as frequencies integer multiples of $1/n'T$ and, when the integer n' is different from the integer n, to determine the IC under test as having a fault. It is preferable that, when the integer n' is equal to the integer n, a fault of the IC under test is determined on the basis of values of spectral power at frequencies in the spectrum, which are integer multiples of $1/nT$.

According to a third aspect of the present invention, a fault detection method for detecting a fault of an IC by monitoring power source current flowing through the IC when the latter is operated by test signals having a constant period T is provided, which is featured by comprising the steps of monitoring a power source current supplied to the IC, obtaining a frequency spectrum of the power source current detected by the monitoring step and determining whether or not the IC has a fault on the basis of values of spectral power at frequencies in the spectrum, which are integer multiples of $1/nT$, where n is an integer preliminary defined for the IC under test.

According to a fourth aspect of the present invention, a fault detection method for detecting a fault of an IC by monitoring power source current flowing through the IC when the latter is operated by test signals having a constant period T is provided, which is featured by comprising the steps of monitoring a power source current supplied to the IC, obtaining a frequency spectrum of the power source current detected by the monitoring step and obtaining an integer n' representative of peak frequencies of respective power peaks in the frequency spectrum as frequencies integer multiples of 1/n'T when a peak frequency in the frequency spectrum of the IC under test obtained by the frequency spectrum is assumed as 1/nT, where n is an integer, and determining the IC as having a fault when the integer n' is different from the integer n. It is preferable that, when the integer n' is equal to the integer n, the method further comprises the step of determining a fault of the IC under test on the basis of values of spectral power at frequencies in the spectrum, which are integer multiples of 1/nT.

BRIEF DESCRIPTION OF THE DRAWINGS

Specific embodiments of the present invention will now be described, by way of example only, with reference to the accompanying of drawings in which.

DETAILED DESCRIPTION OF THE PREFERRED EMBODIMENTS

Figure 1:
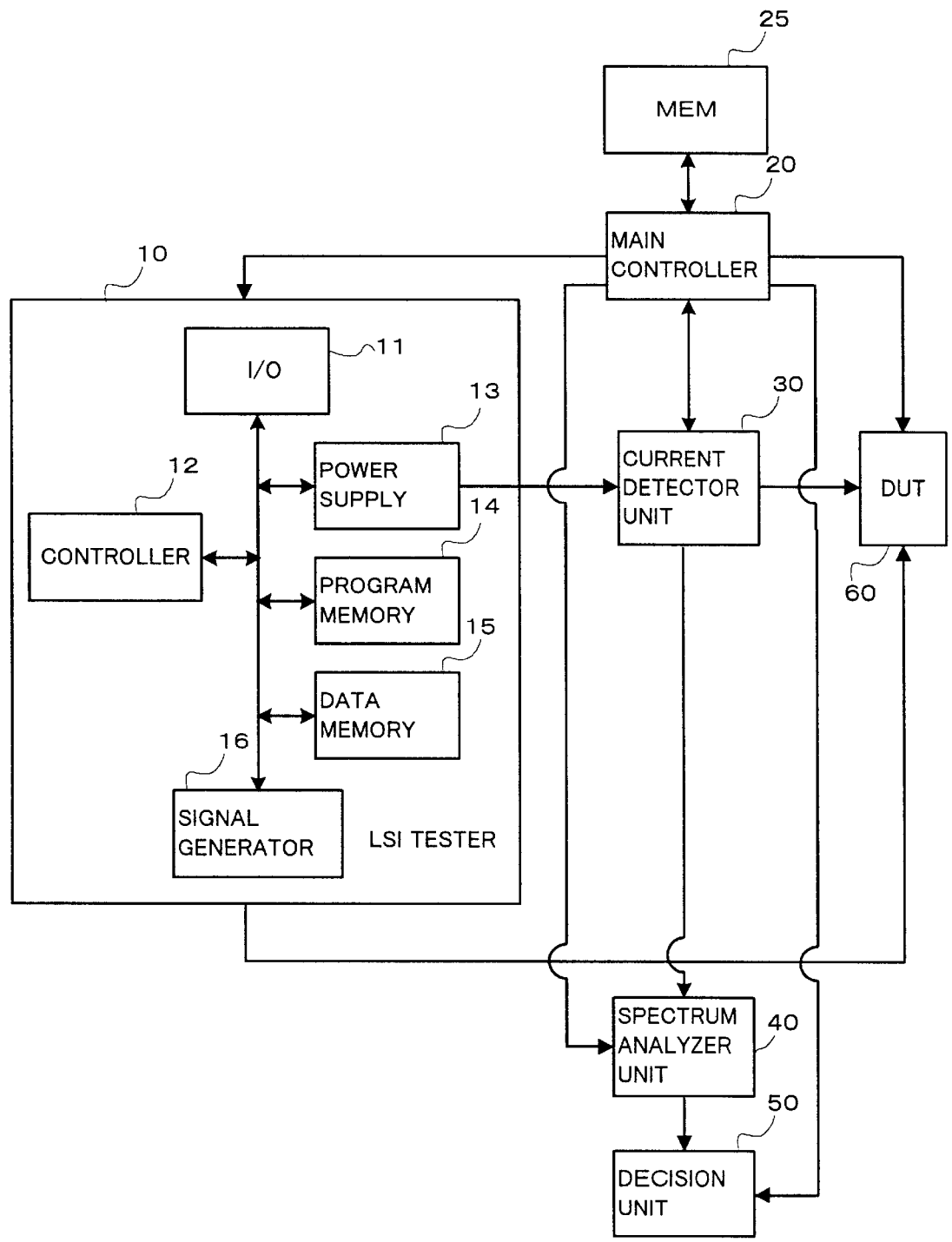
FIG. 1 is a block circuit diagram of an IC fault tester according to the present invention.

A principle of fault test in the present invention will be described first.

In order to perform the fault test of an IC, a test signal having a period T is externally and successively supplied to the IC under test or, when the IC has a self test mode function, such test signal having period T is successively supplied thereto according to the self test mode function. Then, power source current flowing through the IC is monitored and a frequency spectrum of the power source current, which is obtained by the monitoring, is analyzed. From the analysis, it is possible to determine whether the IC under test is acceptable or not. That is, a fault of the IC under test is detected on the basis of a value of power at each frequency of the frequency spectrum, frequencies at which peaks of power are detected, values of peak power and existence or absence of peak.

When the test signal is supplied to the IC under test, power source current flows through the IC. If the IC under test is normal, the power source current is normal. The normal current depends upon various conditions such as the timing of switching transistors constituting the IC and the signal transmission therein. However, power source currents having completely identical waveforms flow through IC's so long as the IC's are identical. On the other hand, when an IC under test has a fault such as, for example, short-circuit fault, delay fault and/or increased resistance value, a waveform of a power source current flowing through the IC becomes different from the normal waveform since an operating state of the IC under test is different from that of the IC having no fault.

Since the test signal having period T is repeatedly supplied to the IC under test, the power source current flowing through the IC has a periodicity. The period of the power source current is normally equal to a supply period T of the test signal. However, depending upon IC under test, the period of the power source current may be nT where n is an integer. On the other hand, when the same test signal is supplied to an IC having a fault with a period T, an abnormal power source current may flow with the period T or nT or with another period n'T due to abnormality of operation of the IC having fault, where n' is an integer different from the integer n.

The frequency spectra of the normal power source current flowing through the normal IC having no fault and the abnormal power source current flowing through an IC having a fault have the same period nT since the test signal having the period T is applied to the normal IC under test and the abnormal IC. Therefore, the frequency component of the power source current contains the basic component 1/nT and high harmonics components thereof. However, since the power source current flowing through the defective IC becomes abnormal compared with that flowing through the normal IC, the frequency spectrum of the power source current flowing through the defective IC becomes different in powers of respective peaks and in frequencies at which the peaks are observed. For example, when the period of the power source current flowing through the defective IC is n'T, the power source current flowing therethrough contains a basic frequency component 1/n'T and high harmonics thereof while the frequency of the power source current flowing through the normal IC contains the basic frequency component 1/nT and high harmonics thereof. That is, frequencies in the frequency spectrum of the power source current flowing through the defective IC at which peaks appear are different from those in the frequency spectrum of the power source current flowing through the normal IC.

Therefore, by preliminary obtaining a frequency spectrum of the power source current flowing through the normal IC, it is possible to determine an IC under test as defective or normal by comparing the frequency spectrum with a frequency spectrum of the power source current flowing through the IC under test.

Referring to FIG. 1 showing a first embodiment of the present invention, a fault tester shown therein comprises an LSI tester 10, which generates a test signal and supplies it to an IC 60 under test, a main controller 20, which controls a fault test of the fault tester by sending various instructions and data required for the fault test to respective components of the fault tester and the IC 60, a memory 25 storing control programs and data required for the operation of the main controller 20, a current detector unit 30 for supplying power to the IC 60 and detecting a current thereof, a spectrum analyzer unit 40 for analyzing a result of detection from the current detector unit 30 and a decision unit 50 for determining, from a result of analysis from the spectrum analyzer unit 40, whether or not there is a fault in the IC 60.

The fault test for the IC 60 is performed by the test signal from the LSI tester 10 and the power from the current detector unit 30, under various controls of the main controller 20.

The LSI tester 10 includes an input/output interface 11 for sending data to and receiving data from the main controller 20, a controller 12 for controlling operations of various portions of the LSI tester 10, a power supply unit 13 for supplying a power defined by a predetermined voltage information to the IC 60 through the current detector unit 30, a program memory 14 storing the operation programs of the LSI tester 10, which includes a test signal generating procedure of the LSI tester 10, a data memory 15 storing various data including signal value data, waveform data, rate data and amplitude data of the test signal to be generated, etc., and a signal generator 16 for generating the test signal. The LSI tester 10 supplies power and the test signal to the IC 60 under test. That is, the power supply unit 13 supplies a predetermined constant voltage or a power indicating a predetermined time change to the IC 60 under test. The signal generator 16 generates a unit test signal having a desired waveforms and duration T, which are determined on the basis of various information such as a variation information of logic value such as "0" and "1", a wave height value of the signal waveform, a timing information and a rate information every predetermined time, repeatedly, and supplies the test signal to the IC 60 as a periodic electric signal having a time period T.

The current detector unit 30 is supplied with the power as the power source of the IC 60 from the LSI tester 10 and supplies the power to the IC 60. Further, the current detector unit 30 monitors the power source current supplied to the IC 60 and generates a monitor signal representing a magnitude of the power source current, that is, a current value signal.

The spectrum analyzer unit 40 is adapted to receive the current value signal generated by the current detector unit 30, analyze the frequency of the current value signal, obtain a signal strength for each frequency and transmit the signal strength information thus obtained to the decision unit 50 as a spectral power information.

The decision unit 50 determines whether or not the IC 60 under test is defective by comparing the spectral power information obtained by the spectrum analyzer unit 40 with a preliminary prepared reference spectrum power information, which is a spectral power information of a normal IC 60.

Figure 2:
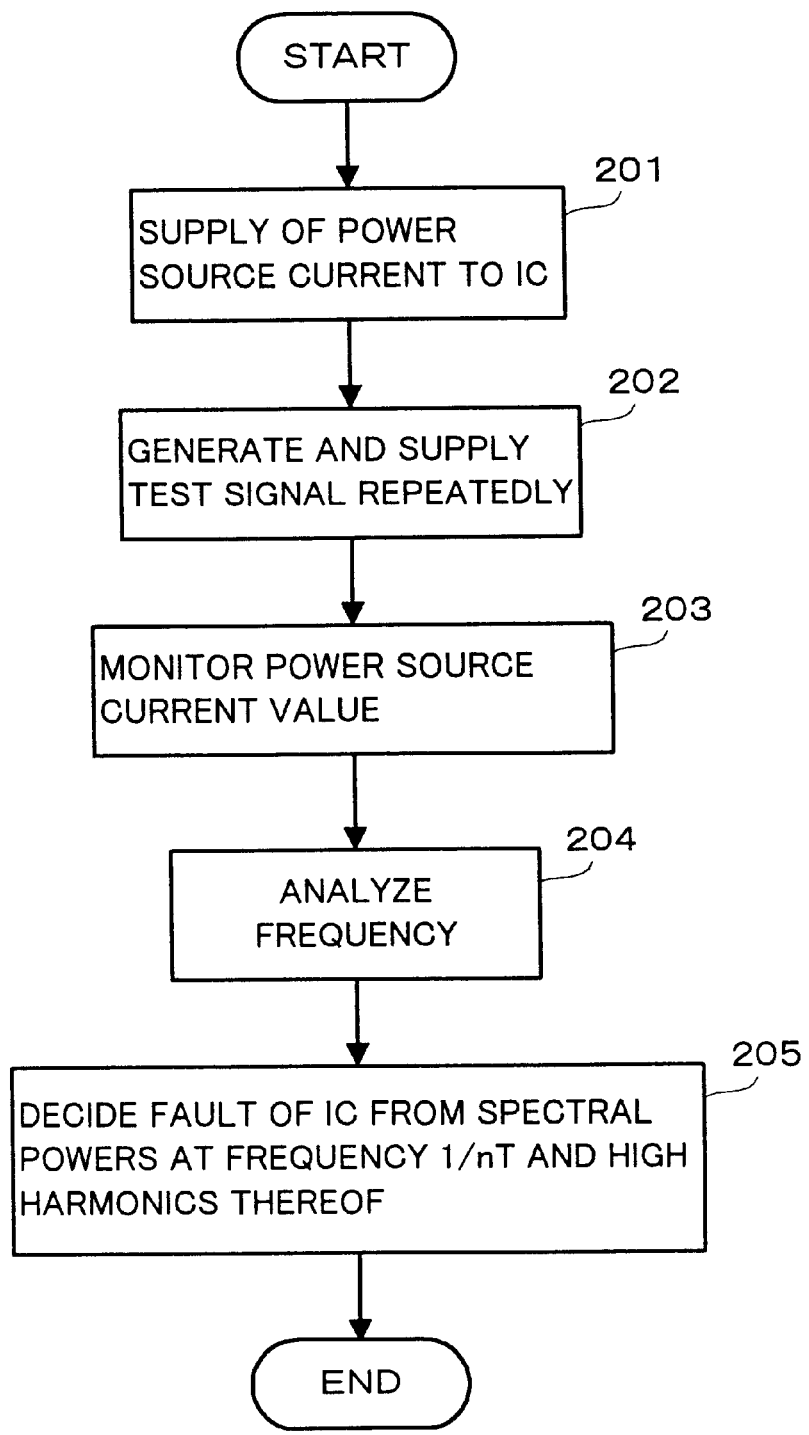
FIG. 2 is a flowchart showing an example of a fault detecting processing.

Referring to FIG. 2 showing an example of the fault test performed by the IC fault tester constructed as shown in FIG. 1, the predetermined voltage is generated by the power supply unit 13 in the LSI tester 10 and supplies the voltage to the IC 60 under test through the current detector unit 30 (step 201). Then, the LSI tester 10 generates the test signal and supplies the test signal to the IC 60 under test (step 202). The test signal is supplied to a portion or all of an input terminal, an output terminal and input/output terminals of the IC 60, except a power source terminal. Then, the current detector unit 30 detects the power source current supplied to the IC 60 under test, generates the monitor signal indicative of the magnitude of the power source current and sends the monitor signal to the spectrum analyzer unit 40 (step 203). The spectrum analyzer unit 40 analyzes the frequency of the power source current on the basis of the monitor signal from the current detection unit and sends a result of the frequency analysis to the decision unit 50 (step 204). In this analysis, the spectral power of the power source current at frequencies 1/nT, 2/nT, 3/nT, 4/nT, 5/nT and so on, that is, frequencies, which are integer multiples of 1/nT, are monitored, where n is a predetermined integer. The decision unit 50 determines whether or not the IC 60 under test is defective, by comparing the result of the frequency analysis from the spectrum analyzer unit 40, that is, the values of the spectral power information of the power source current flowing through the IC 60 at the frequencies, which are integer multiples of 1/nT, with the preliminary prepared and stored values of the spectral power information of the normal IC and outputs the result (step 205).

Figure 3:
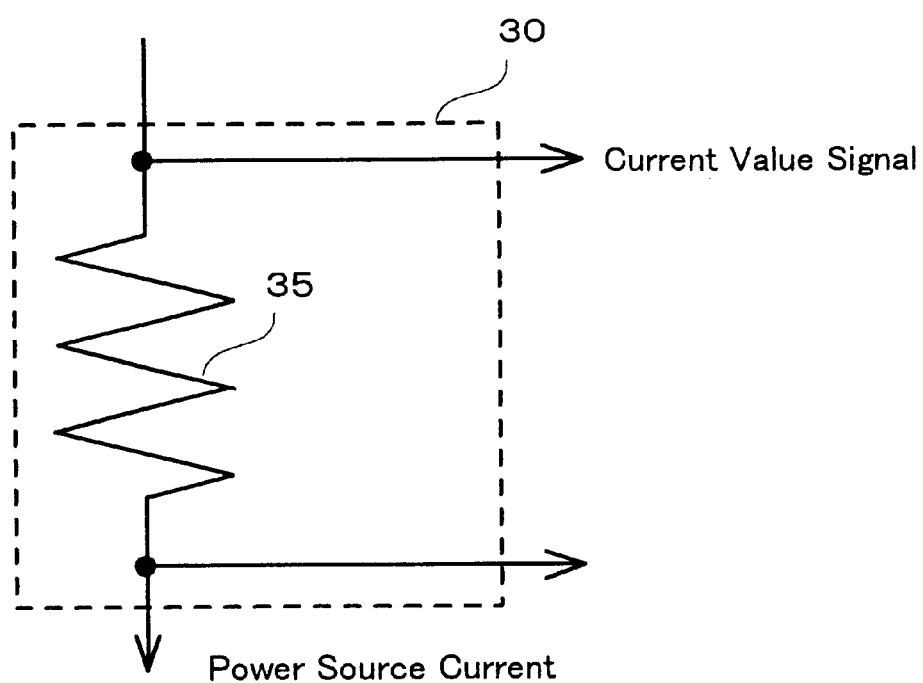
FIG. 3 is a block circuit diagram of a current detection unit of the IC fault tester shown in FIG. 1.

FIG. 3 is a block diagram showing a construction of an example of the current detector unit 30. The current detector unit 30 includes a current detection resistor 35 having a small resistance value. The power source current is supplied to the IC 60 through the current detection resistor 35. The power source current is converted into a voltage value by the current detection resistor 35 and outputs thereby as a current value signal. The resistance value of the power source current detection resistor 35 is small enough to not influence the operation of the IC 60 under test.

Figure 4:
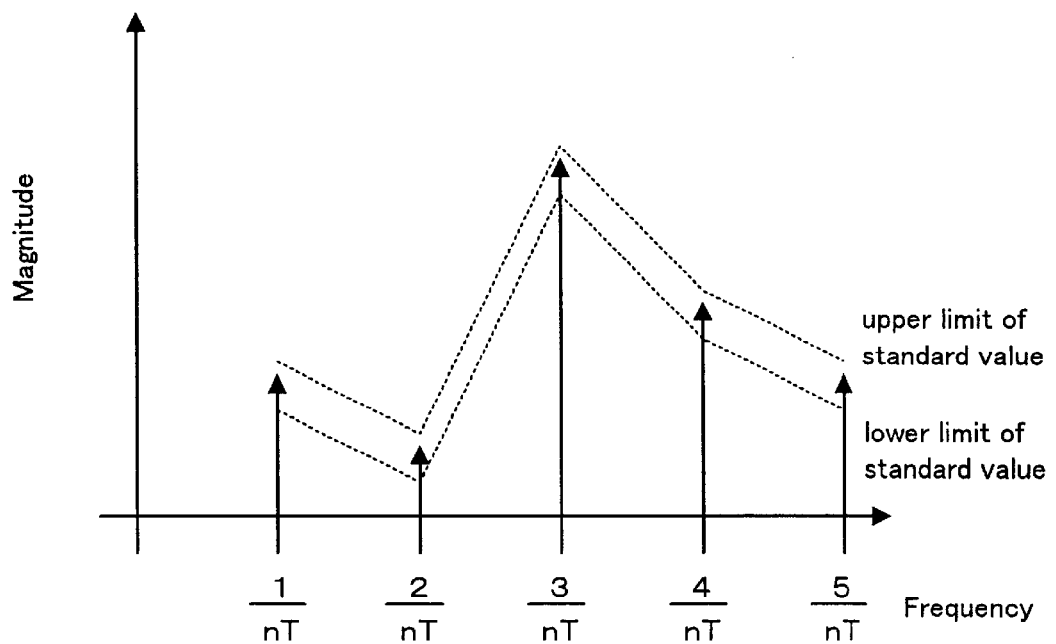
FIG. 4 shows an example of a result of frequency analysis when an IC under test has no fault.
Figure 5:
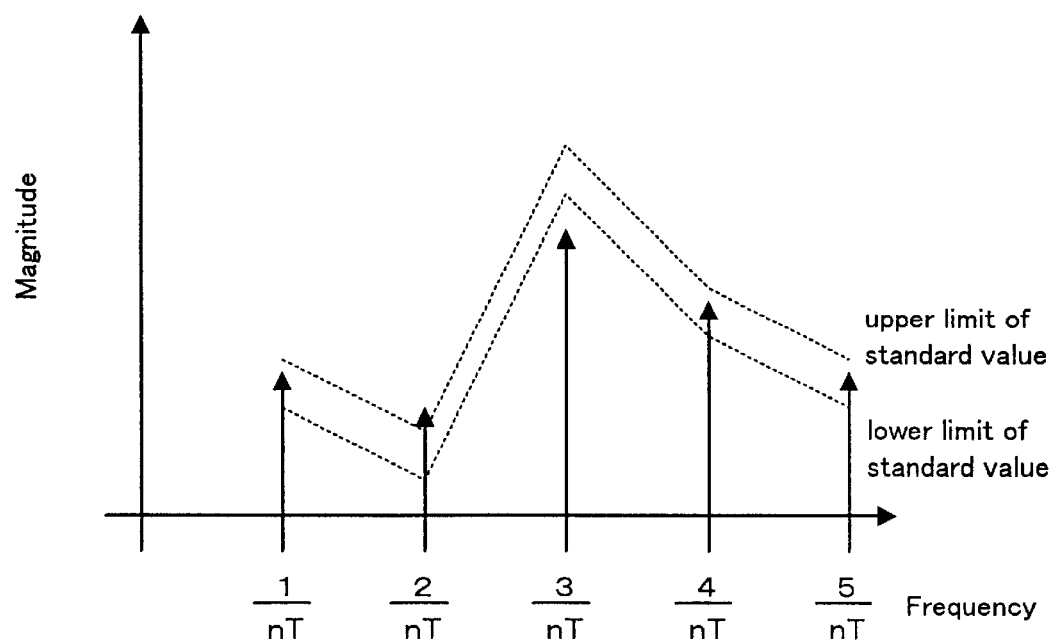
FIG. 5 shows an example of a result of frequency analysis when an IC under test has a fault.

FIGS. 4 and 5 are graphs illustrating the frequency analysis to be performed in the spectrum analyzer unit 40, that is, a relation between the spectrum power of power source current and normalized values corresponding thereto for explaining the decision processing performed in the decision unit 50. Since the application period T of the test signal is T, a current having a period of nT flows depending upon the situation of the state of the IC 60 under test, where n is an integer equal to or larger than 1. Therefore, the frequency of the power source current, peaks of the power source current are observed at the frequency 1/nT and high harmonics thereof, respectively, as shown by arrows in FIGS. 4 and 5. However, when any fault exists in the IC 60 under test, the power source current flowing therethrough becomes different depending upon the fault even when the same test signal is supplied thereto. Therefore, the fault of the IC under test can be determined by preliminary preparing the spectral power of the power source current when there is no fault in the IC as a reference spectral power information and comparing it with the monitored spectral power.

Ranges shown by dotted lines in FIGS. 4 and 5 depict the reference information of the above mentioned spectral power information, in which the upper limit value and the lower limit value are determined at respective frequencies, that is, frequency 1/nT and high harmonics thereof. The upper and lower limit values are preliminary set from data of the IC 60 which has no fault or data from similar IC for setting the reference spectral power information by taking various errors into consideration. In a case where the spectral power information actually observed are within the limit values at respective frequencies as shown in FIG. 4, the IC 60 under test is determined as acceptable. On the other hand, in a case where the spectral power information actually observed are out of the limit values at a certain frequency or frequencies as shown in FIG. 5, the IC 60 under test is determined as unacceptable.

Figure 6:
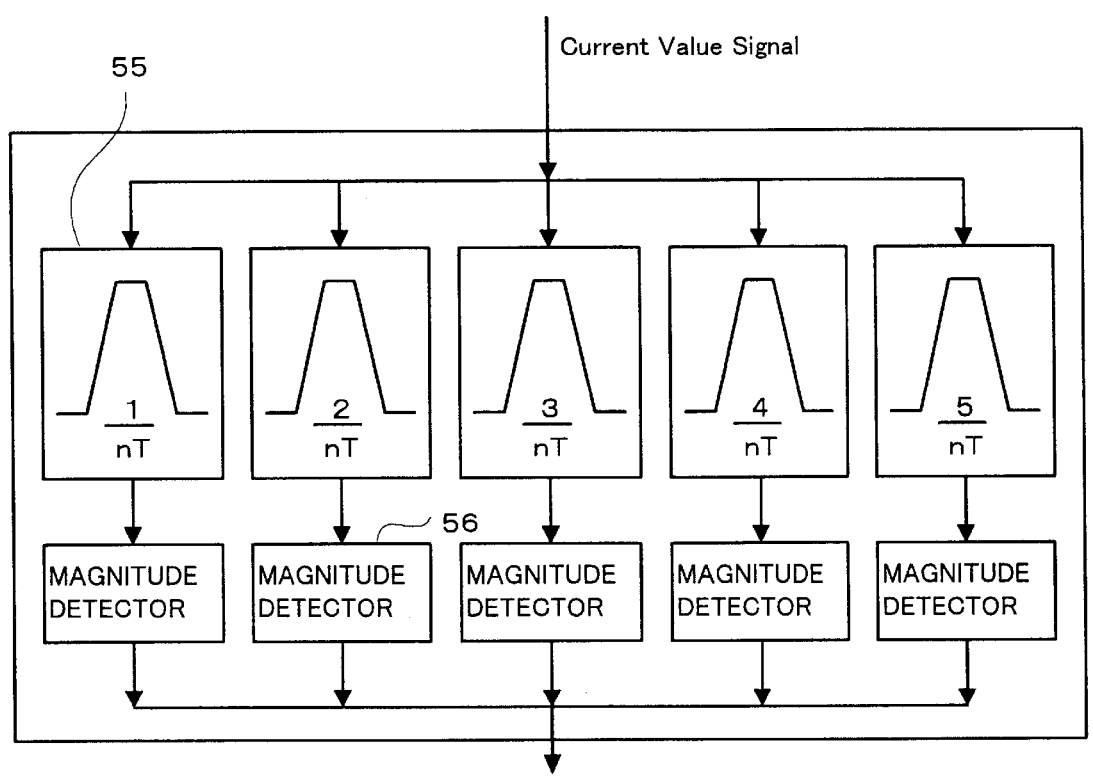
FIG. 6 is a block diagram of a spectrum analysis unit of the IC fault tester shown in FIG. 1.

Although a usual spectrum analyzer or a FET analyzer may be used as the spectrum analyzer unit 40, it is possible to embody the present invention by using a simpler circuit. An example of such circuit of the spectrum analyzer unit 40 is shown in FIG. 6. The spectrum analyzer unit 40 in the case shown in FIG. 6 includes a band-pass filter 55 allowing frequency band including frequency 1/nT and high harmonics thereof to pass through and a magnitude detector 56 for monitoring magnitudes of signals passed through the filter. With such construction of the spectrum analyzer unit 40, it is possible to measure the spectral power in the vicinity of frequency 1/nT and high harmonics thereof, where T is the application period of the test signal to the IC under test.

Figure 7:
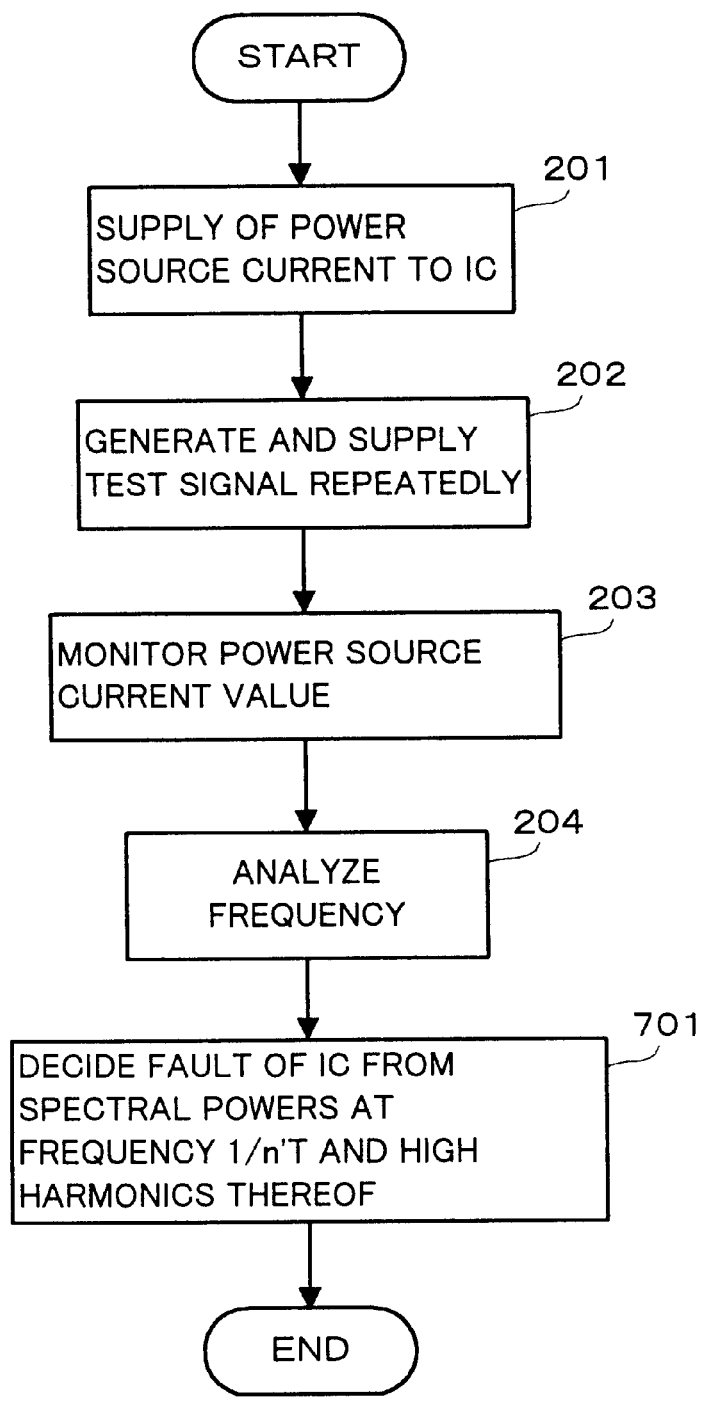
FIG. 7 is a flowchart showing another example of a fault detecting processing.

FIG. 7 is a flowchart showing another example of the fault test. In this example, the steps before the frequency analysis are the same as those shown in FIG. 2 and the step for deciding a fault of the IC under test on the basis of peak values at frequency 1/n'T and high harmonics thereof for the obtained frequency spectrum (step 701) is different. That is, when it is assumed that the frequencies at which the peaks of the frequency spectrum of the IC under test are obtained are 1/nT and high harmonics thereof, an integer n' of frequency 1/n'T, which represents each of frequencies in the frequency spectrum obtained by the frequency analysis, at which power peaks are observed, as a frequency which is an integer multiple of 1/n'T and, when the integer n' is different from the integer n, a fault of the IC under test is decided.

Figure 8:
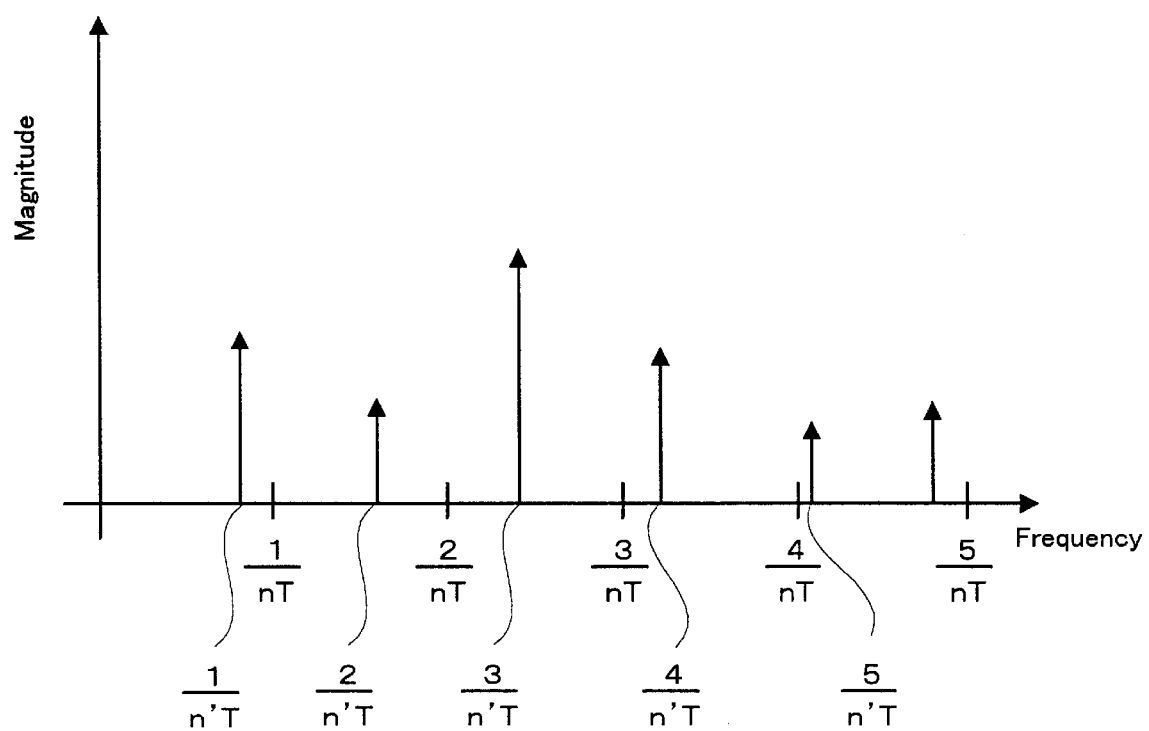
FIG. 8 shows an example of a result of frequency analysis for explaining a fault determination processing.

FIG. 8 is a graph explaining this fault decision processing. In FIG. 8, it is assumed that, as a result of the spectrum analysis of power source current performed by the spectrum analyzer unit 40, a spectral power information such as shown in FIG. 8 is obtained, that is, peaks are observed at the frequency 1/n'T and high harmonic frequencies thereof, that is, 2/n'T, 3/n'T, . . . . Since it is preliminarily known that, when there is no fault in the IC 60, peaks of the spectral power appear at the frequency 1/nT and high harmonic frequencies thereof, that is, 2/nT, 3/nT, . . . , the IC 60 under test is decided as defective when the integer n' is different from the integer n.

Figure 9:
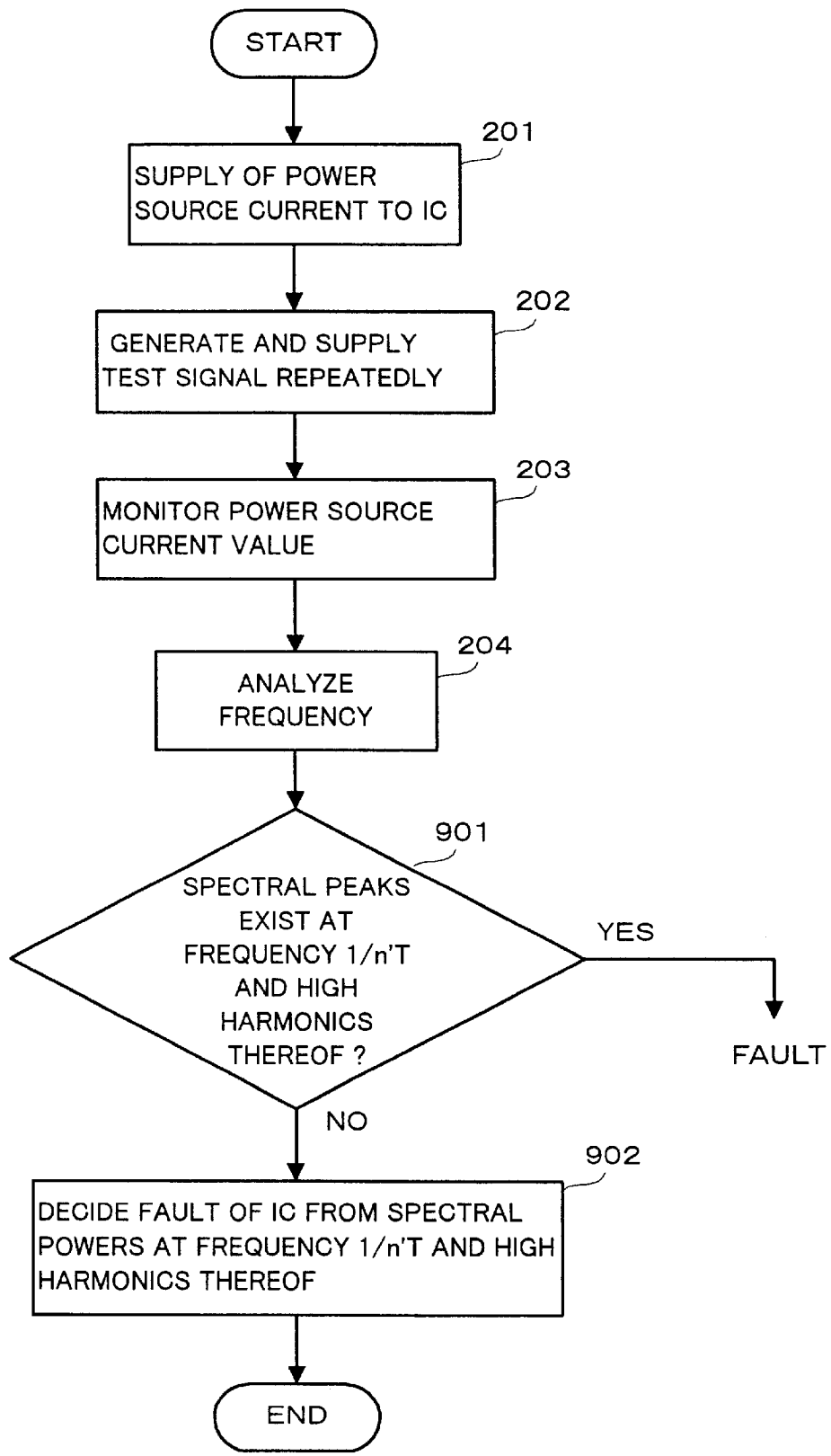
FIG. 9 is a flowchart showing a further example of a fault detecting processing.
Figure 10:
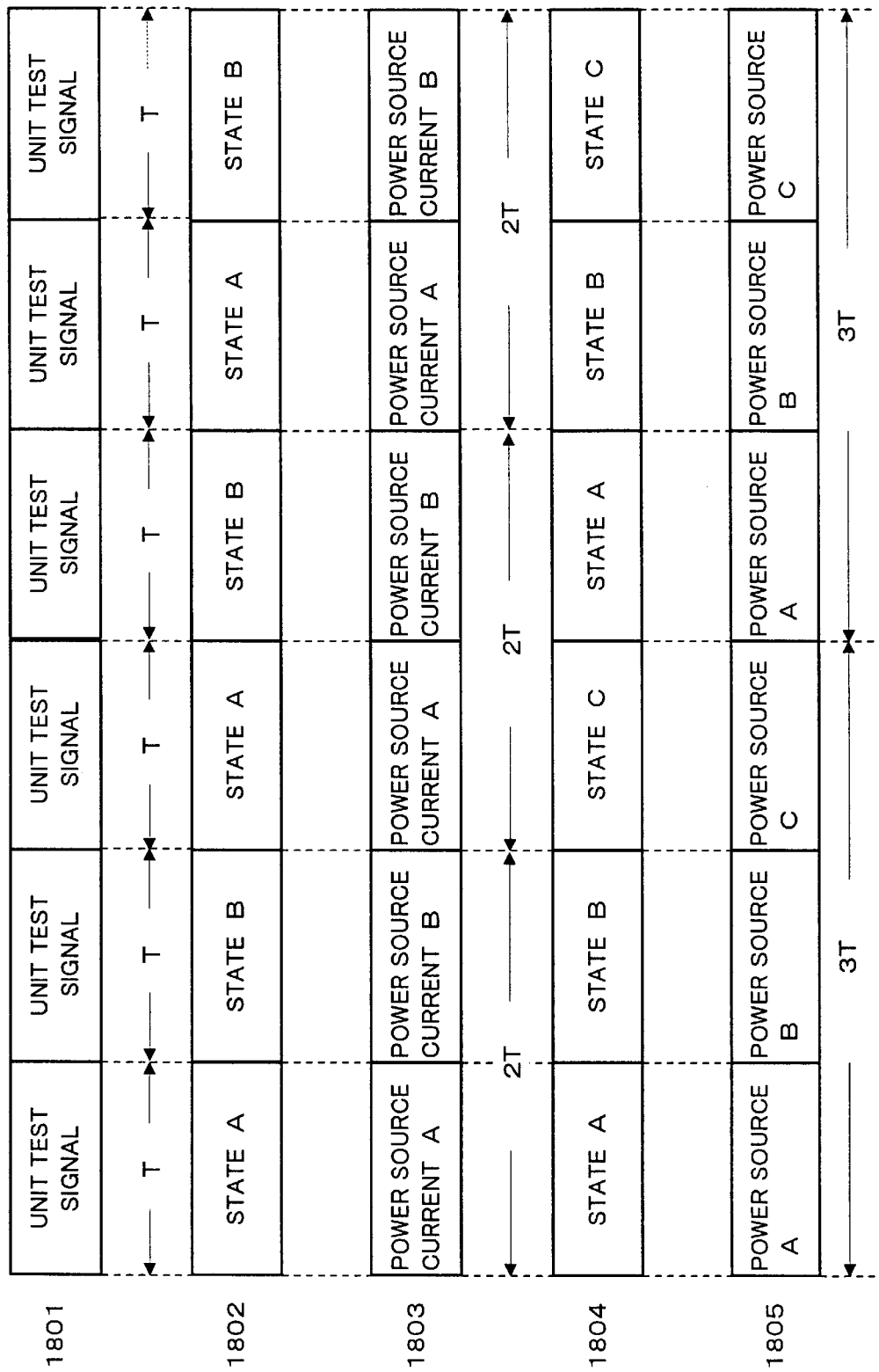
FIG. 10 explains a period of power source current waveform with respect to a unit test signal having a period T in a fault test of an IC.

FIG. 9 is a flowchart showing a further example of the fault test. The flowchart shown in FIG. 9 differs from that shown in FIG. 7 in that, in addition to the determination of whether the integer n' is different from the integer n, a similar decision to that performed in the step 205 shown in FIG. 2 is performed when the integer n' is equal to the integer n.

That is, the decision unit 50 obtains, from the result of measurement of the spectral power information, an integer n' of frequency 1/n'T, which represents each of frequencies in the frequency spectrum obtained by the frequency analysis, at which power peaks are observed, as a frequency which is an integer multiple of 1/n'T, that is, 2/n'T, 3/n'T, . . . , decides a fault of the IC 60 under test by comparing the integer n' with the preset integer n and outputs a result of the decision (step 901). That is, when the integer n' is different from the integer n, the fault of the IC under test is decided. On the other hand, when the integer n' is equal to the integer n, it is decided whether or not the measured values of the spectral power are within a range of the predetermined standard. When the measured values are within the range of the predetermined standards, the IC 60 under test is decided as having no fault otherwise, the IC 60 is decided as defective and the result of the decision is output (step 902).

In the above described embodiments, the special device, that is, the LSI tester 10, is used in order to generate the test signal. As to other function than the power supply function, a test signal generation function for generating the test signal can be used if such function is incorporated in the IC 60 under test. Further, it is possible to execute a portion or all of the function of the LSI tester 10 with using other devices. The program memory 14 and the data memory 15 may be realized by utilizing a memory provided within the main controller 20 or an externally provided memory.

Further, the main controller 20, the spectrum analyzer unit 40, the decision unit 50 and other portion of the tester can be realized as not only a computer software but also a hardware. Such software may be stored in a magnetic disk, a semiconductor memory such as ROM (Read Only Memory), an optical disk or other recording media and the above described various functions can be realized by loading it from the recording medium to a computer processing device.

Although the present invention has been described with reference to the preferred embodiments, it should be noted that the present invention is not limited thereto and the preferred embodiments can be modified in various ways within the scope of the technical thought of the present invention.

What is claimed is:

1. A fault tester for detecting a fault of an integrated circuit by monitoring power source current flowing through said integrated circuit when said integrated circuit is operated by test signals having a constant period T, comprising:

current detector for monitoring a power source current supplied to said integrated circuit;

spectrum analyzer for obtaining a frequency spectrum of the power source current detected by said current detector; and decision unit for deciding whether or not said integrated circuit has a fault on the basis of values of spectral power at frequencies in the spectrum, said values are at least two integer multiples of 1/nT, where n is an integer preliminary defined for said integrated circuit.

2. A fault tester for detecting a fault of an integrated circuit by monitoring power source current flowing through said integrated circuit when said integrated circuit is operated by test signals having a constant period T, comprising:

current detector for monitoring a power source current supplied to said integrated circuit;

spectrum analyzer for obtaining a frequency spectrum of the power source current detected by said current detector; and decision unit for determining whether or not said integrated circuit has a fault, said decision unit being adapted, when a peak frequency in the frequency spectrum of said integrated circuit under test obtained by said spectrum analyzer is assumed as 1/nT, where n is an integer, to obtain an integer n' representative of peak frequencies of respective power peaks of the frequency spectrum as frequencies integer multiples of 1/n'T and, when the integer n' is different from the integer n, to decide said integrated circuit under test as having a fault.

3. A fault tester as claimed in claim 2, wherein, when the integer n' is equal to the integer n, a fault of said integrated circuit under test is decided on the basis of values of spectral power at frequencies in the spectrum, said values are at least two integer multiples of 1/nT.

4. A fault detection method for detecting a fault of an integrated circuit by monitoring power source current flowing through said integrated circuit when said integrated circuit is operated by test signals having a constant period T, comprising the steps of:

monitoring a power source current supplied to said integrated circuit;

obtaining a frequency spectrum of the power source current detected by the monitoring step; and deciding whether or not said integrated circuit has a fault on the basis of values of spectral power at frequencies in the spectrum, said values being at least two integer multiples of 1/nT, where n is an integer preliminary defined for the integrated circuit under test.

5. A recording medium recorded with a control program for executing the fault detection method claimed in claim 4.

6. A fault detection method for detecting a fault of an integrated circuit by monitoring power source current flowing through said integrated circuit when said integrated circuit is operated by test signals having a constant period T, comprising the steps of:

monitoring a power source current supplied to said integrated circuit;

obtaining a frequency spectrum of the power source current detected by the monitoring step; and obtaining an integer n' representative of peak frequencies of respective power peaks in the frequency spectrum as frequencies integer multiples of 1/n'T when a peak frequency in the frequency spectrum of said integrated circuit under test obtained by the frequency spectrum is assumed as 1/nT, where n is an integer, and deciding said integrated circuit as having a fault when the integer n' is different from the integer n.

7. A fault detection method as claimed in claim 6, wherein, when the integer n' is equal to the integer n, the method further comprises the step of deciding a fault of said integrated circuit under test on the basis of values of spectral power at frequencies in the spectrum, said values are at least two integer multiples of 1/nT.

8. A recording medium recorded with a control program for executing fault detection method claimed in claim 7.

9. A recording medium recorded with a control program for executing fault detection method claimed in claim 6.

* * * * *